United States Patent
Itai et al.

(10) Patent No.: US 8,980,749 B1
(45) Date of Patent: *Mar. 17, 2015

(54) METHOD FOR CHEMICAL MECHANICAL POLISHING SILICON WAFERS

(71) Applicants: Rohm and Haas Electronic Materials CMP Holdings, Inc., Newark, DE (US); Nitta Haas Incorporated, Osaka (JP)

(72) Inventors: Yasuyuki Itai, Kyoto (JP); Bainian Qian, Newark, DE (US); Hiroyuki Nakano, Kyotanabe (JP); David B. James, Newark, DE (US); Naoko Kawai, Kyoto (JP); Katsumasa Kawabata, Kyoto (JP); Koichi Yoshida, Kyoto (JP); Kazutaka Miyamoto, Mie (JP); James Murnane, Norristown, PA (US); Fengji Yeh, Wilmington, DE (US); Marty W. DeGroot, Middletown, DE (US)

(73) Assignees: Rohm and Haas Electronic Materials CMP Holdings, Inc., Newark, DE (US); Nitta Haas Incorporated, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/062,060

(22) Filed: Oct. 24, 2013

(51) Int. Cl.
*H01L 21/302* (2006.01)
*H01L 21/461* (2006.01)
*H01L 21/306* (2006.01)
*B24B 37/24* (2012.01)

(52) U.S. Cl.
CPC .......... *H01L 21/30625* (2013.01); *B24B 37/24* (2013.01)
USPC ....................................... 438/692

(58) Field of Classification Search
CPC .................... H01L 21/30625; B24B 37/24
USPC ................. 216/88, 89; 438/692, 693
See application file for complete search history.

(56) References Cited

U.S. PATENT DOCUMENTS

| 6,120,353 | A | 9/2000 | Suzuki et al. |
| 6,189,546 | B1 | 2/2001 | Zhang et al. |
| 6,306,021 | B1 | 10/2001 | Masumura et al. |
| 6,783,436 | B1 | 8/2004 | Muldowney |
| 2012/0264303 | A1 | 10/2012 | Chen et al. |
| 2014/0120809 | A1* | 5/2014 | Qian et al. ............... 451/59 |

FOREIGN PATENT DOCUMENTS

| EP | 1129821 | 9/2001 |
| JP | 05-283515 | 10/1993 |
| JP | 10-106955 | 4/1998 |
| JP | 2002-292556 | 10/2002 |

* cited by examiner

*Primary Examiner* — Roberts Culbert
(74) *Attorney, Agent, or Firm* — Thomas S. Deibert

(57) ABSTRACT

A method for polishing a silicon wafer is provided, comprising: providing a silicon wafer; providing a polishing pad having a polishing layer which is the reaction product of raw material ingredients, including: a polyfunctional isocyanate; and, a curative package; wherein the curative package contains an amine initiated polyol curative and a high molecular weight polyol curative; wherein the polishing layer exhibits a density of greater than 0.4 g/cm$^3$; a Shore D hardness of 5 to 40; an elongation to break of 100 to 450%; and, a cut rate of 25 to 150 µm/hr; and, wherein the polishing layer has a polishing surface adapted for polishing the silicon wafer; and, creating dynamic contact between the polishing surface and the silicon wafer.

10 Claims, 10 Drawing Sheets

METHOD FOR CHEMICAL MECHANICAL POLISHING SILICON WAFERS

The present invention relates to the polishing of silicon wafers. More particularly, the present invention relates to a method of polishing of a silicon wafer using a chemical mechanical polishing pad comprising a polishing layer, wherein the polishing layer exhibits a density of greater than 0.4 g/cm$^3$; a Shore D hardness of 5 to 40; an elongation to break of 100 to 450%; and, a cut rate of 25 to 150 μm/hr; and, wherein the polishing layer has a polishing surface adapted for polishing the silicon wafer.

Silicon wafers used in the semiconductor industry typically require a very high degree of surface perfection before they can be utilized in device manufacture. The silicon wafer surfaces are typically produced using chemical mechanical polishing of the silicon wafer surfaces with a chemical mechanical polishing pad in combination with a polishing slurry. The surface of the silicon wafer being polishing is generally bathed or rinsed in a polishing slurry while the polish surface of a polishing pad is pressed against the surface of the silicon wafer and rotated such that the combined action of the polishing surface and the polishing slurry operates to polishing the surface of the silicon wafer. Ideally, this process results in the selective removal of projecting surface features so that when the process is finished a perfectly planar surface is produced down to the finest level of detail.

Silicon wafers are typically prepared by a process that includes three polishing steps. First, a double sided "stock removal" polishing step is performed following the sawing, grinding and etching of rough silicon wafers from a cylindrical single crystal silicon ingot; wherein the grinding damage in the single crystal is removed and two planar, parallel surfaces are formed. Typically, about 10 to 20 μm of material are removed from each side of the silicon wafers during this stock removal polishing step. Second, a "final polish" polishing step is performed, wherein the front side of the silicon wafer is polished to remove scratches and handling traces from the stock removal polishing step. Typically, about 100 nm to 5 μm of material is removed from the front side of the silicon wafer during this final polish polishing step. Third, a "haze free" polishing step is performed, wherein the front side of the silicon wafer is polished smooth to an angstrom level as required for microelectronic chip production. Typically, only a 10 to 100 nm of material is removed from the front side of the silicon wafer during this haze free polishing step.

The number and permissible size of any surface imperfections on the silicon wafer surface remaining after polishing is continually decreasing. Some of the most critical material specifications for silicon wafers are: the surface metals content, the front surface micro roughness and the total particle per unit area.

Conventional polishing pads used for polishing of silicon wafers typically comprise a velour type pad composed of a polyurethane impregnated polyester nonwoven fabric or a poromeric soft urethane foam.

A family of poromeric soft urethane foam type polishing pads are disclosed by Iwase, et al. in U.S. Pat. No. 7,897,250. Iwase et al. discloses a polishing pad comprising a soft urethane foam sheet having foam cells with opened pores formed on a surface of the foam sheet, the opened pores being formed by opening the foam cells by a buffing or slicing process, wherein a percentage of said opened pores having opened pore diameters falling in a range of from between about 30 μm to 50 μm is at least 50% and the number of opened pores per 1 mm$^2$ on said surface falls in a range of between about 50 to 100, and at least some of said foam cells have lengths of at least about 70% of a length of the soft urethane sheet in a thickness direction thereof, and wherein an average value of a ratio of diameters of opened pores of the foam cells on the surface on which the opened pores are formed to diameters of the opened pores at a depth position of at least about 200 μm from the surface on which the opened pores are formed falls in a range of from between about 0.65 to 0.95.

Conventional poromeric soft urethane foam polishing pads used for polishing exhibit a tear drop like pore structure, wherein the cross section of the pores parallel to the polishing surface of the polishing layer increases as the polishing layer wears during polishing, which may result in a lack of polishing stability during the life of the polishing pad.

Accordingly, there remains a continuing need for improved polishing pads for polishing of silicon wafers.

The present invention provides a method for polishing of a silicon wafer, comprising: providing a silicon wafer, having a surface; providing a chemical mechanical polishing pad, wherein the chemical mechanical polishing pad comprises a polishing layer which is the reaction product of raw material ingredients, comprising: a polyfunctional isocyanate; and, a curative package, comprising: at least 5 wt % of an amine initiated polyol curative, wherein the amine initiated polyol curative contains at least one nitrogen atom per molecule; wherein the amine initiated polyol curative has an average of at least three hydroxyl groups per molecule; 25 to 95 wt % of a high molecular weight polyol curative, wherein the high molecular weight polyol curative has a number average molecular weight, $M_N$, of 2,500 to 100,000; and wherein the high molecular weight polyol curative has an average of 3 to 10 hydroxyl groups per molecule; and, 0 to 70 wt % of a difunctional curative; wherein the polishing layer exhibits a density of greater than 0.4 g/cm$^3$; a Shore D hardness of 5 to 40; an elongation to break of 100 to 450%; and, a cut rate of 25 to 150 μm/hr; and, wherein the polishing layer has a polishing surface adapted for polishing the silicon wafer; and, creating dynamic contact between the polishing surface of the polishing layer and the surface of the silicon wafer, wherein the surface of the silicon wafer is polished.

The present invention provides a method for haze free polishing of a silicon wafer, comprising: providing a silicon wafer, having a front surface; providing a chemical mechanical polishing pad, wherein the chemical mechanical polishing pad comprises a polishing layer which is the reaction product of raw material ingredients, comprising: a polyfunctional isocyanate; and, a curative package, comprising: at least 5 wt % of an amine initiated polyol curative, wherein the amine initiated polyol curative contains at least one nitrogen atom per molecule; wherein the amine initiated polyol curative has an average of at least three hydroxyl groups per molecule; 25 to 95 wt % of a high molecular weight polyol curative, wherein the high molecular weight polyol curative has a number average molecular weight, $M_N$, of 2,500 to 100,000; and wherein the high molecular weight polyol curative has an average of 3 to 10 hydroxyl groups per molecule; and, 0 to 70 wt % of a difunctional curative; wherein the polishing layer exhibits a density of greater than 0.4 g/cm$^3$; a Shore D hardness of 5 to 40; an elongation to break of 100 to 450%; and, a cut rate of 25 to 150 μm/hr; and, wherein the polishing layer has a polishing surface adapted for polishing the silicon wafer; and, creating dynamic contact between the polishing surface of the polishing layer and the front surface of the silicon wafer, wherein the front surface of the silicon wafer is haze free polished, wherein the front surface of the silicon wafer is haze free polished to a haze of <0.075 ppm.

The present invention provides a method for haze free polishing of a silicon wafer, comprising: providing a silicon wafer, having a front surface; providing a chemical mechanical polishing pad, wherein the chemical mechanical polishing pad comprises a polishing layer which is the reaction product of raw material ingredients, comprising: a polyfunctional isocyanate; and, a curative package, comprising: at least 5 wt % of an amine initiated polyol curative, wherein the amine initiated polyol curative contains at least one nitrogen atom per molecule; wherein the amine initiated polyol curative has an average of at least three hydroxyl groups per molecule; 25 to 95 wt % of a high molecular weight polyol curative, wherein the high molecular weight polyol curative has a number average molecular weight, $M_N$, of 2,500 to 100,000; wherein the high molecular weight polyol curative has an average of 3 to 10 hydroxyl groups per molecule; and, 0 to 70 wt % of a difunctional curative; wherein the stoichiometric ratio of the reactive hydrogen groups in the curative package to the unreacted isocyanate groups in the polyfunctional isocyanate is 0.85 to 1.15; and, wherein the polishing layer exhibits a density of greater than 0.4 g/cm$^3$; a Shore D hardness of 5 to 40; an elongation to break of 100 to 450%; and, a cut rate of 25 to 150 µm/hr; and, wherein the polishing layer has a polishing surface adapted for polishing the silicon wafer; and, creating dynamic contact between the polishing surface of the polishing layer and the front surface of the silicon wafer, wherein the front surface of the silicon wafer is haze free polished, wherein the front surface of the silicon wafer is haze free polished to a haze of <0.075 ppm.

The present invention provides a method for haze free polishing of a silicon wafer, comprising: providing a silicon wafer, having a front surface; providing a chemical mechanical polishing pad, wherein the chemical mechanical polishing pad comprises a polishing layer which is the reaction product of raw material ingredients, comprising: a polyfunctional isocyanate, wherein the polyfunctional isocyanate is selected from the group consisting of an aliphatic polyfunctional isocyanate, an aromatic polyfunctional isocyanate and a mixture thereof; and, a curative package, comprising: at least 5 wt % of an amine initiated polyol curative, wherein the amine initiated polyol curative contains at least one nitrogen atom per molecule; wherein the amine initiated polyol curative has an average of at least three hydroxyl groups per molecule; 25 to 95 wt % of a high molecular weight polyol curative, wherein the high molecular weight polyol curative has a number average molecular weight, $M_N$, of 2,500 to 100,000; and wherein the high molecular weight polyol curative has an average of 3 to 10 hydroxyl groups per molecule; and, 0 to 70 wt % of a difunctional curative; wherein the polishing layer exhibits a density of greater than 0.4 g/cm$^3$; a Shore D hardness of 5 to 40; an elongation to break of 100 to 450%; and, a cut rate of 25 to 150 µm/hr; and, wherein the polishing layer has a polishing surface adapted for polishing the silicon wafer; and, creating dynamic contact between the polishing surface of the polishing layer and the front surface of the silicon wafer, wherein the front surface of the silicon wafer is haze free polished, wherein the front surface of the silicon wafer is haze free polished to a haze of <0.075 ppm.

The present invention provides a method for haze free polishing of a silicon wafer, comprising: providing a silicon wafer, having a front surface; providing a chemical mechanical polishing pad, wherein the chemical mechanical polishing pad comprises a polishing layer which is the reaction product of raw material ingredients, comprising: a polyfunctional isocyanate, wherein the polyfunctional isocyanate is selected from the group consisting of an aliphatic polyfunctional isocyanate, an aromatic polyfunctional isocyanate and a mixture thereof; wherein the polyfunctional isocyanate is an isocyanate-terminated urethane prepolymer having 2 to 12 wt % unreacted NCO groups; and, a curative package, comprising: at least 5 wt % of an amine initiated polyol curative, wherein the amine initiated polyol curative contains at least one nitrogen atom per molecule; wherein the amine initiated polyol curative has an average of at least three hydroxyl groups per molecule; 25 to 95 wt % of a high molecular weight polyol curative, wherein the high molecular weight polyol curative has a number average molecular weight, $M_N$, of 2,500 to 100,000; and wherein the high molecular weight polyol curative has an average of 3 to 10 hydroxyl groups per molecule; and, 0 to 70 wt % of a difunctional curative, wherein the difunctional curative is selected from the group consisting of diol curatives and diamine curatives; wherein the polishing layer exhibits a density of greater than 0.6 g/cm$^3$; a Shore D hardness of 5 to 40; an elongation to break of 100 to 450%; and, a cut rate of 25 to 150 µm/hr; and, wherein the polishing layer has a polishing surface adapted for polishing the silicon wafer; and, creating dynamic contact between the polishing surface of the polishing layer and the front surface of the silicon wafer, wherein the front surface of the silicon wafer is haze free polished, wherein the front surface of the silicon wafer is haze free polished to a haze of <0.075 ppm.

The present invention provides a method for haze free polishing of a silicon wafer, comprising: providing a silicon wafer, having a front surface; providing a chemical mechanical polishing pad, wherein the chemical mechanical polishing pad comprises a polishing layer which is the reaction product of raw material ingredients, comprising: a polyfunctional isocyanate, wherein the polyfunctional isocyanate is selected from the group consisting of an aliphatic polyfunctional isocyanate, an aromatic polyfunctional isocyanate and a mixture thereof; wherein the polyfunctional isocyanate is an isocyanate-terminated urethane prepolymer having 2 to 12 wt % unreacted NCO groups; and, a curative package, comprising: 5 to 20 wt % of the amine initiated polyol curative, wherein the amine initiated polyol curative contains two nitrogen atom per molecule; wherein the amine initiated polyol curative has an average of 4 hydroxyl groups per molecule; and, wherein the amine initiated polyol curative has a number average molecular weight, $M_N$, of 200 to 400; 50 to 75 wt % of the high molecular weight polyol curative, wherein the high molecular weight polyol curative has a number average molecular weight, $M_N$, of 10,000 to 12,000; and, wherein the high molecular weight polyol curative has an average of 6 hydroxyl groups per molecule; 10 to 30 wt % of the difunctional curative; wherein the difunctional curative is a diamine curative selected from the group consisting of 4,4'-methylene-bis-(2-chloroaniline) (MBOCA); 4,4'-methylene-bis-(3-chloro-2,6-diethylaniline) (MCDEA); and, isomers thereof; and, 0 to 70 wt % of a difunctional curative, wherein the difunctional curative is selected from the group consisting of diol curatives and diamine curatives; wherein the stoichiometric ratio of the reactive hydrogen groups in the curative package to the unreacted isocyanate groups in the polyfunctional isocyanate is 0.95 to 1.05; wherein the polishing layer exhibits a density of 0.65 to 0.85 g/cm$^3$; a Shore D hardness of 10 to 40; an elongation to break of 150 to 350%; and, a cut rate of 30 to 60 µm/hr; and, wherein the polishing layer has a polishing surface adapted for polishing the silicon wafer; and, creating dynamic contact between the polishing surface of the polishing layer and the front surface of the silicon wafer, wherein the front surface of the silicon wafer is haze free polished, wherein the front surface of the silicon wafer is haze free polished to a haze of <0.075 ppm.

The present invention provides a method for haze free polishing of a silicon wafer, comprising: providing a silicon wafer, having a front surface; providing a chemical mechanical polishing pad, wherein the chemical mechanical polishing pad comprises a polishing layer which is the reaction product of raw material ingredients, comprising: a polyfunctional isocyanate, wherein the polyfunctional isocyanate is selected from the group consisting of an aliphatic polyfunctional isocyanate, an aromatic polyfunctional isocyanate and a mixture thereof; wherein the polyfunctional isocyanate is an isocyanate-terminated urethane prepolymer having 5 to 7 wt % unreacted NCO groups; and, wherein the isocyanate-terminated urethane prepolymer exhibits a number average molecular weight, $M_N$, of 400 to 2,500; and, a curative package, comprising: 5 to 20 wt % of the amine initiated polyol curative, wherein the amine initiated polyol curative contains two nitrogen atom per molecule; wherein the amine initiated polyol curative has an average of 4 hydroxyl groups per molecule; and, wherein the amine initiated polyol curative has a number average molecular weight, $M_N$, of 200 to 400; 50 to 75 wt % of the high molecular weight polyol curative, wherein the high molecular weight polyol curative has a number average molecular weight, $M_N$, of 10,000 to 12,000; and, wherein the high molecular weight polyol curative has an average of 6 hydroxyl groups per molecule; 10 to 30 wt % of the difunctional curative; wherein the difunctional curative is a diamine curative selected from the group consisting of 4,4'-methylene-bis-(2-chloroaniline) (MBOCA); 4,4'-methylene-bis-(3-chloro-2,6-diethylaniline) (MCDEA); and, isomers thereof; and, 0 to 70 wt % of a difunctional curative, wherein the difunctional curative is selected from the group consisting of diol curatives and diamine curatives; wherein the stoichiometric ratio of the reactive hydrogen groups in the curative package to the unreacted isocyanate groups in the polyfunctional isocyanate is 0.95 to 1.05; wherein the polishing layer exhibits a density of 0.65 to 0.85 g/cm$^3$; a Shore D hardness of 10 to 40; an elongation to break of 150 to 350%; and, a cut rate of 30 to 60 µm/hr; and, wherein the polishing layer has a polishing surface adapted for polishing the silicon wafer, wherein the polishing layer has a spiral groove pattern formed therein; and, creating dynamic contact between the polishing surface of the polishing layer and the front surface of the silicon wafer, wherein the front surface of the silicon wafer is haze free polished, wherein the front surface of the silicon wafer is haze free polished to a haze of <0.075 ppm.

DETAILED DESCRIPTION

Figure 1:
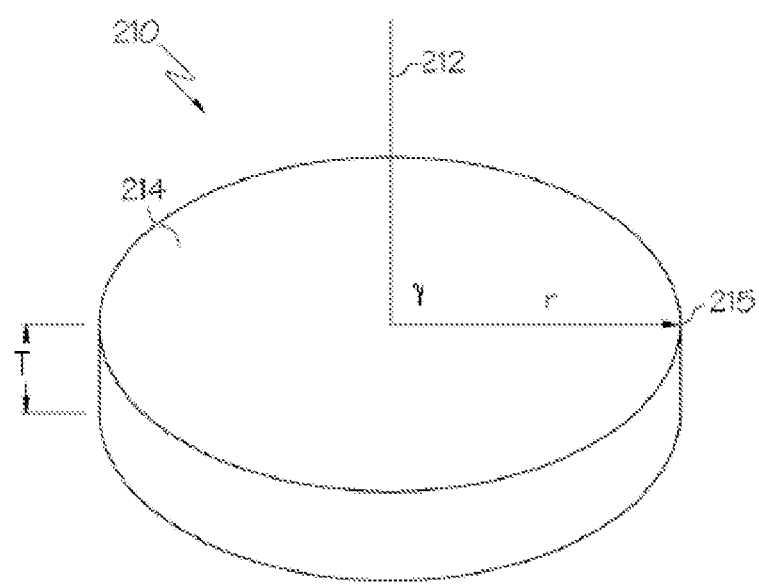
FIG. 1 is a side perspective view of a preferred polishing layer of a chemical mechanical polishing pad used in the method of the present invention.

The term "circumference fraction grooved" or "CF" as used herein and in the appended claims is defined by the following formula:

$$CF = \left\{ \frac{\text{(Portion of circumference at a given radius,}}{\text{(Full circumference at the given radius, R)}} \right\}$$

Note that if CF is constant as a function of radius for the polishing surface of a given polishing layer, then the fractional portion of the polishing surface that is grooved (or ungrooved) at a given radius will also be constant as a function of radius.

The term "majority distance" or "MD" used herein and in the appended claims means 90% of the distance along a line drawn from the outer radius, $R_O$, of a polishing surface to an origin, O, at the center of the polishing surface. That is, the majority distance is defined by the following equation:

$$MD = 0.9 * R_O.$$

Preferably, the method of the present invention for polishing of a silicon wafer (preferably, for haze free polishing of a silicon wafer), comprises: providing a silicon wafer, having a surface (preferably, having a front surface); providing a chemical mechanical polishing pad, wherein the chemical mechanical polishing pad comprises a polishing layer which is the reaction product of raw material ingredients, comprising: a polyfunctional isocyanate; and, a curative package, comprising: at least 5 wt % (preferably 5 to 30 wt %; more preferably 5 to 25 wt %; most preferably 5 to 20 wt %) of an amine initiated polyol curative, wherein the amine initiated polyol curative contains at least one nitrogen atom per molecule (preferably, wherein the amine initiated polyol curative contains one to four nitrogen atoms per molecule; more preferably, wherein the amine initiated polyol curative contains two to four nitrogen atoms per molecule; most preferably, wherein the amine initiated polyol curative contains two nitrogen atoms per molecule); wherein the amine initiated polyol curative has an average of at least three hydroxyl groups (preferably 3 to 6 hydroxyl groups; more preferably 3 to 5 hydroxyl groups; most preferably 4 hydroxyl groups) per molecule; (preferably wherein the amine initiated polyol curative has a number average molecular weight of ≤700; more preferably 150 to 650; still more preferably 200 to 500; most preferably 250 to 300); 25 to 95 wt % (preferably 35 to 90 wt %; more preferably 50 to 75 wt %; most preferably 60 to 75 wt %) of a high molecular weight polyol curative, wherein the high molecular weight polyol curative has a number average molecular weight, $M_N$, of 2,500 to 100,000 (preferably 5,000 to 50,000; more preferably 7,500 to 25,000; most preferably 10,000 to 12,000); and wherein the high molecular weight polyol curative has an average of 3 to 10 hydroxyl groups (preferably 4 to 8 hydroxyl groups; more preferably 5 to 7; most preferably 6) per molecule; and, 0 to 70 wt % (preferably 5 to 60 wt %; more preferably 10 to 50 wt %; still more preferably 10 to 30 wt %; most preferably 10 to 20 wt %) of a difunctional curative; wherein the polishing layer exhibits a density of ≥0.4 g/cm$^3$ (preferably, ≥0.6; more preferably, 0.6 to 1.2 g/cm$^3$; still more preferably, 0.65 to 1.1 g/cm$^3$; most preferably, 0.65 to 0.85 g/cm$^3$); a Shore D hardness of 5 to 40 (preferably 10 to 40; more preferably 10 to 30; most preferably 20 to 30); an elongation to break of 100 to 450% (preferably 125 to 425%; more preferably 150 to 350%; most preferably 150 to 200%); and, a cut rate of 25 to 150 μm/hr (preferably 30 to 125 μm/hr; more preferably 30 to 100 μm/hr; most preferably 30 to 60 μm/hr); and, wherein the polishing layer has a polishing surface adapted for polishing the silicon wafer; and, creating dynamic contact between the polishing surface of the polishing layer and the surface of the silicon wafer (preferably, the front surface of the silicon wafer), wherein the surface of the silicon wafer is polished (preferably, wherein the front surface of the silicon wafer is haze free polished; more preferably, wherein the front surface of the silicon wafer is haze free polished to a haze of <0.075 ppm (preferably, <0.075 ppm; more preferably, <0.072 ppm; most preferably, <0.07 ppm)).

Preferably, the silicon wafer polished in the method of the present invention is a monocrystalline silicon wafer. Preferably, the silicon wafer has a front surface; wherein the front surface is haze free polished using the method of the present invention.

The polishing layer of the chemical mechanical polishing pad used in the method of the present invention exhibits a unique combination of low hardness (i.e., Shore D≤40) to provide low defect polishing performance and a low tensile elongation (i.e., elongation to break ≤450%) which provides both machinability to facilitate the formation of grooves in the polishing layer and conditionability to facilitate polishing surface renewal during polishing. In addition, the balance of properties enabled by the polishing layer of the chemical mechanical polishing pad used in the method of the present invention provides the ability to, for example, polish silicon wafers to reduce haze without damaging the wafer surface.

Preferably, the polishing layer used in the method of the present invention has a central axis, 212, and is adapted for rotation about the central axis. (See FIG. 1). Preferably, the polishing surface, 214, of the polishing layer, 210, is in a plane substantially perpendicular to the central axis, 212. Preferably, the polishing layer, 210, is adapted for rotation in a plane that is at an angle, γ, of 80 to 100° to the central axis, 212. More preferably, the polishing layer, 210, is adapted for rotation in a plane that is at an angle, γ, of 85 to 95° to the central axis, 212. Most preferably, the polishing layer, 210, is adapted for rotation in a plane that is at an angle, γ, of 89 to 91° to the central axis, 212. Preferably, the polishing layer, 210, has a polishing surface, 214, that has a substantially circular cross section perpendicular to the central axis, 212. Preferably, the radius, r, of the cross section of the polishing surface, 214, perpendicular to the central axis, 212, varies by ≤20% for the cross section. More preferably, the radius, r, of the cross section of the polishing surface, 214, perpendicular to the central axis, 212, varies by ≤10% for the cross section.

Preferably, the polyfunctional isocyanate used in the formation of the polishing layer of the chemical mechanical polishing pad used in the method of the present invention contains two reactive isocyanate groups (i.e., NCO).

Preferably, the polyfunctional isocyanate used in the formation of the polishing layer of the chemical mechanical polishing pad used in the method of the present invention is selected from the group consisting of an aliphatic polyfunctional isocyanate, an aromatic polyfunctional isocyanate and a mixture thereof. More preferably, the polyfunctional isocyanate used in the formation of the polishing layer of the chemical mechanical polishing pad used in the method of the present invention is a diisocyanate selected from the group consisting of 2,4-toluene diisocyanate; 2,6-toluene diisocyanate; 4,4'-diphenylmethane diisocyanate; naphthalene-1,5-diisocyanate; tolidine diisocyanate; para-phenylene diisocyanate; xylylene diisocyanate; isophorone diisocyanate; hexamethylene diisocyanate; 4,4'-dicyclohexylmethane diisocyanate; cyclohexanediisocyanate; and, mixtures thereof. Still more preferably, the polyfunctional isocyanate used in the formation of the polishing layer of the chemical mechanical polishing pad used in the method of the present invention is an isocyanate terminated urethane prepolymer formed by the reaction of a diisocyanate with a prepolymer polyol.

Preferably, the isocyanate-terminated urethane prepolymer used in the formation of the polishing layer of the chemical mechanical polishing pad used in the method of the present invention has 2 to 12 wt % unreacted isocyanate (NCO) groups. More preferably, the isocyanate-terminated urethane prepolymer used in the formation of the polishing layer of the chemical mechanical polishing pad used in the method of the present invention has 2 to 10 wt % (still more preferably 4 to 8 wt %; most preferably 5 to 7 wt %) unreacted isocyanate (NCO) groups.

Preferably the prepolymer polyol used to form the polyfunctional isocyanate terminated urethane prepolymer is selected from the group consisting of diols, polyols, polyol diols, copolymers thereof and mixtures thereof. More preferably, the prepolymer polyol is selected from the group consisting of polyether polyols (e.g., poly(oxotetramethylene) glycol, poly(oxypropylene)glycol and mixtures thereof); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the prepolymer polyol is selected from the group consisting of polytetramethylene ether glycol (PTMEG); ester based polyols (such as ethylene adipates, butylene adipates); polypropylene ether glycols (PPG); polycaprolactone polyols; copolymers thereof; and, mixtures thereof. Most preferably, the prepolymer polyol is selected from the group consisting of PTMEG and PPG.

Preferably, when the prepolymer polyol is PTMEG, the isocyanate terminated urethane prepolymer has an unreacted isocyanate (NCO) concentration of 2 to 10 wt % (more preferably, of 4 to 8 wt %; most preferably, 6 to 7 wt %). Examples of commercially available PTMEG based isocyanate terminated urethane prepolymers include Imuthane® prepolymers (available from COIM USA, Inc., such as, PET-80A, PET-85A, PET-90A, PET-93A, PET-95A, PET-60D, PET-70D, PET-75D); Adiprene® prepolymers (available from Chemtura, such as, LF 800A, LF 900A, LF 910A, LF 930A, LF 931A, LF 939A, LF 950A, LF 952A, LF 600D, LF 601D, LF 650D, LF 667, LF 700D, LF750D, LF751D, LF752D, LF753D and L325); Andur® prepolymers (available from Anderson Development Company, such as, 70APLF, 80APLF, 85APLF, 90APLF, 95APLF, 60DPLF, 70APLF, 75APLF).

Preferably, when the prepolymer polyol is PPG, the isocyanate terminated urethane prepolymer has an unreacted isocyanate (NCO) concentration of 3 to 9 wt % (more preferably 4 to 8 wt %, most preferably 5 to 6 wt %). Examples of commercially available PPG based isocyanate terminated urethane prepolymers include Imuthane® prepolymers (available from COIM USA, Inc., such as, PPT-80A, PPT-90A, PPT-95A, PPT-65D, PPT-75D); Adiprene® prepolymers (available from Chemtura, such as, LFG 963A, LFG 964A, LFG 740D); and, Andur® prepolymers (available from Anderson Development Company, such as, 8000APLF, 9500APLF, 6500DPLF, 7501DPLF).

Preferably, the isocyanate terminated urethane prepolymer used in the formation of the polishing layer of the chemical mechanical polishing pad used in the method of the present invention is a low free isocyanate terminated urethane prepolymer having less than 0.1 wt % free toluene diisocyanate (TDI) monomer content.

Non-TDI based isocyanate terminated urethane prepolymers can also be used. For example, isocyanate terminated urethane prepolymers include those formed by the reaction of 4,4'-diphenylmethane diisocyanate (MDI) and polyols such as polytetramethylene glycol (PTMEG) with optional diols such as 1,4-butanediol (BDO) are acceptable. When such isocyanate terminated urethane prepolymers are used, the unreacted isocyanate (NCO) concentration is preferably 4 to 10 wt % (more preferably 4 to 8 wt %, most preferably 5 to 7 wt %). Examples of commercially available isocyanate terminated urethane prepolymers in this category include Imuthane® prepolymers (available from COIM USA, Inc. such as 27-85A, 27-90A, 27-95A); Andur® prepolymers (available from Anderson Development Company, such as, IE75AP, IE80AP, IE 85AP, IE90AP, IE95AP, IE98AP); and, Vibrathane® prepolymers (available from Chemtura, such as, B625, B635, B821).

The curative package used in the formation of the polishing layer of the chemical mechanical polishing pad used in the method of the present invention preferably contains: at least 5 wt % (preferably 5 to 30 wt %; more preferably 5 to 25 wt %; most preferably 5 to 20 wt %) of an amine initiated polyol curative; 25 to 95 wt % (preferably 35 to 90 wt %; more preferably 50 to 75 wt %; most preferably 60 to 75 wt %) of a high molecular weight polyol curative; and, 0 to 70 wt % (preferably 5 to 60 wt %; more preferably 10 to 15 wt %; still more preferably 10 to 30 wt %; most preferably 10 to 20 wt %) of a difunctional curative.

Preferably, the amine initiated polyol curative used in the formation of the polishing layer of the chemical mechanical polishing pad used in the method of the present invention contains at least one nitrogen atom per molecule. More preferably, the amine initiated polyol curative used contains one to four (still more preferably two to four; most preferably two) nitrogen atoms per molecule.

Preferably, the amine initiated polyol curative used in the formation of the polishing layer of the chemical mechanical polishing pad used in the method of the present invention has an average of at least three hydroxyl groups per molecule. More preferably, the amine initiated polyol curative used has an average of three to six (still more preferably three to five; most preferably four) hydroxyl groups per molecule.

Preferably, the amine initiated polyol curative used in the formation of the polishing layer of the chemical mechanical polishing pad used in the method of the present invention has a number average molecular weight, $M_N$, of ≤700. More preferably, the amine initiated polyol curative used has a number average molecular weight, $M_N$, of 150 to 650 (still more preferably 200 to 500; most preferably 250 to 300).

Preferably, the amine initiated polyol curative used in the formation of the polishing layer of the chemical mechanical polishing pad used in the method of the present invention has a hydroxyl number (as determined by ASTM Test Method D4274-11) of 350 to 1,200 mg KOH/g. More preferably, the amine initiated polyol curative used has a hydroxyl number of 400 to 1,000 mg KOH/g (most preferably 600 to 850 mg KOH/g).

Examples of commercially available amine initiated polyol curatives include the Voranol® family of amine initiated polyols (available from The Dow Chemical Company); the Quadrol® Specialty Polyols (N,N,N',N'-tetrakis(2-hydroxypropyl ethylene diamine))(available from BASF); Pluracol® amine based polyols (available from BASF); Multranol® amine based polyols (available from Bayer MaterialScience LLC); triisopropanolamine (TIPA) (available from The Dow Chemical Company); and, triethanolamine (TEA) (available from Mallinckrodt Baker Inc.). A number of preferred amine initiated polyol curatives are listed in TABLE 1.

TABLE 1

| Amine initiated polyol curative | Number of OH groups per molecule | $M_N$ | Hydroxyl Number (mg KOH/g) |
|---|---|---|---|
| Triethanolamine | 3 | 149 | 1130 |
| Triisopropanolamine | 3 | 192 | 877 |
| MULTRANOL ® 9138 Polyol | 3 | 240 | 700 |
| MULTRANOL ® 9170 Polyol | 3 | 481 | 350 |
| VORANOL ® 391 Polyol | 4 | 568 | 391 |
| VORANOL ® 640 Polyol | 4 | 352 | 638 |
| VORANOL ® 800 Polyol | 4 | 280 | 801 |
| QUADROL ® Polyol | 4 | 292 | 770 |
| MULTRANOL ® 4050 Polyol | 4 | 356 | 630 |
| MULTRANOL ® 4063 Polyol | 4 | 488 | 460 |
| MULTRANOL ® 8114 Polyol | 4 | 568 | 395 |
| MULTRANOL ® 8120 Polyol | 4 | 623 | 360 |
| MULTRANOL ® 9181 Polyol | 4 | 291 | 770 |
| VORANOL ® 202 Polyol | 5 | 590 | 475 |

Without wishing to be bound by theory, in addition to promoting the desired balance of physical properties in the polishing layer produced therewith, it is believed that the concentration of the amine initiated polyol curative used in the curative package also acts to autocatalyze its reaction and the reaction of any difunctional curative in the curative package with the unreacted isocyanate (NCO) groups present in the polyfunctional diisocyante.

Preferably, the high molecular weight polyol curative used in the formation of the polishing layer of the chemical mechanical polishing pad used in the method of the present invention has a number average molecular weight, $M_N$, of 2,500 to 100,000. More preferably, the high molecular weight polyol curative used has a number average molecular weight, $M_N$, of 5,000 to 50,000 (still more preferably 7,500 to 25,000; most preferably 10,000 to 12,000).

Preferably, the high molecular weight polyol curative used in the formation of the polishing layer of the chemical mechanical polishing pad used in the method of the present invention has an average of three to ten hydroxyl groups per molecule. More preferably, the high molecular weight polyol curative used has an average of four to eight (still more preferably five to seven; most preferably six) hydroxyl groups per molecule.

Preferably, the high molecular weight polyol curative used in the formation of the polishing layer of the chemical mechanical polishing pad used in the method of the present invention has a molecular weight that is higher than the molecular weight of the amine initiated polyol curative used in the curative package; and, has a hydroxyl number that is lower than that of the amine initiated curative used in the curative package.

Examples of commercially available high molecular weight polyol curatives include Specflex® polyols, Voranol® polyols and Voralux® polyols (available from The Dow Chemical Company); Multranol® Specialty Polyols and Ultracel® Flexible Polyols (available from Bayer MaterialScience LLC); and Pluracol® Polyols (available from BASF). A number of preferred high molecular weight polyol curatives are listed in TABLE 2.

TABLE 2

| High molecular weight polyol curative | Number of OH groups per molecule | $M_N$ | Hydroxyl Number (mg KOH/g) |
|---|---|---|---|
| Multranol ® 3901 Polyol | 3.0 | 6,000 | 28 |
| Pluracol ® 1385 Polyol | 3.0 | 3,200 | 50 |
| Pluracol ® 380 Polyol | 3.0 | 6,500 | 25 |
| Pluracol ® 1123 Polyol | 3.0 | 7,000 | 24 |
| ULTRACEL ® 3000 Polyol | 4.0 | 7,500 | 30 |
| SPECFLEX ® NC630 Polyol | 4.2 | 7,602 | 31 |
| SPECFLEX ® NC632 Polyol | 4.7 | 8,225 | 32 |
| VORALUX ® HF 505 Polyol | 6.0 | 11,400 | 30 |
| MULTRANOL ® 9185 Polyol | 6.0 | 3,366 | 100 |
| VORANOL ® 4053 Polyol | 6.9 | 12,420 | 31 |

Preferably, the difunctional curative used in the formation of the polishing layer of the chemical mechanical polishing pad used in the method of the present invention is selected from diols and diamines. More preferably, the difunctional curative used is a diamine selected from the group consisting of primary amines and secondary amines. Still more preferably, the difunctional curative used is selected from the group consisting of diethyltoluenediamine (DETDA); 3,5-dimethylthio-2,4-toluenediamine and isomers thereof; 3,5-diethyltoluene-2,4-diamine and isomers thereof (e.g., 3,5-diethyltoluene-2,6-diamine); 4,4'-bis-(sec-butylamino)-diphenylmethane; 1,4-bis-(sec-butylamino)-benzene; 4,4'-methylene-bis-(2-chloroaniline); 4,4'-methylene-bis-(3-chloro-2,6-diethylaniline) (MCDEA); polytetramethyleneoxide-di-p-aminobenzoate; N,N'-dialkyl-diamino diphenyl methane; p,p'-methylene dianiline (MDA); m-phenylenediamine (MPDA); 4,4'-methylene-bis-(2-chloroaniline) (MBOCA); 4,4'-methylene-bis-(2,6-diethylaniline) (MDEA); 4,4'-methylene-bis-(2,3-dichloroaniline) (MDCA); 4,4'-diamino-3,3'-diethyl-5,5'-dimethyl diphenylmethane, 2,2',3,3'-tetrachloro diamino diphenylmethane; trimethylene glycol di-p-aminobenzoate; and mixtures thereof. Most preferably, the diamine curing agent used is selected from the group consisting of 4,4'-methylene-bis-(2-chloroaniline) (MBOCA); 4,4'-methylene-bis-(3-chloro-2,6-diethylaniline) (MCDEA); and, isomers thereof.

Preferably, the stoichiometric ratio of the reactive hydrogen groups (i.e., the sum of the amine ($NH_2$) groups and the hydroxyl (OH) groups) in the components of the curative package to the unreacted isocyanate (NCO) groups in the polyfunctional isocyanate is 0.85 to 1.15 (more preferably 0.90 to 1.10; most preferably 0.95 to 1.05).

The polishing layer of the chemical mechanical polishing pad used in the method of the present invention optionally further comprises a plurality of microelements. Preferably, the plurality of microelements are uniformly dispersed throughout the polishing layer. Preferably, the plurality of microelements is selected from entrapped gas bubbles, hollow core polymeric materials, liquid filled hollow core polymeric materials, water soluble materials and an insoluble phase material (e.g., mineral oil). More preferably, the plurality of microelements is selected from entrapped gas bubbles and hollow core polymeric materials uniformly distributed throughout the polishing layer. Preferably, the plurality of microelements has a weight average diameter of ≤150 µm (preferably, 5 to 100 µm; more preferably, 20 to 75 µm; most preferably, 30 to 50 µm). Preferably, the plurality of microelements comprise polymeric microballoons with shell walls of either polyacrylonitrile or a polyacrylonitrile copolymer (e.g., Expancel® polymeric microballoons from Akzo Nobel). Preferably, the plurality of microelements are incorporated into the polishing layer at 0 to 35 vol % porosity (more preferably 10 to 25 vol % porosity).

The polishing layer of the chemical mechanical polishing pad used in the method of the present invention can be provided in both porous and nonporous (i.e., unfilled) configurations. Preferably, the polishing layer of the chemical mechanical polishing pad used in the method of the present invention exhibits a density of ≥0.4 g/cm$^3$ as measured according to ASTM D1622. More preferably, the polishing layer of the chemical mechanical polishing pad used in the method of the present invention exhibits a density of ≥0.6 (more preferably, 0.6 to 1.2 g/cm$^3$; still more preferably, 0.65 to 1.1 g/cm$^3$; most preferably, 0.65 to 0.85 g/cm$^3$) as measured according to ASTM D1622.

Preferably, the polishing layer of the chemical mechanical polishing pad used in the method of the present invention exhibits a Shore D hardness of 5 to 40 as measured according to ASTM D2240. More preferably, the polishing layer of the chemical mechanical polishing pad used in the method of the present invention exhibits a Shore D hardness of 10 to 40 (still more preferably 10 to 30; most preferably 20 to 30) as measured according to ASTM D2240.

Conventional polishing layer formulations that exhibit a Shore D hardness of less than 40 typically have very high elongation to break values (i.e., >600%). Materials exhibiting such high elongation to break values reversibly deform when subjected to machining operations, which results in groove formation that is unacceptably poor and texture creation during diamond conditioning that is insufficient. The unique curative package used in the formation of the polishing layer of the chemical mechanical polishing pad used in the method of the present invention; however, provide a low hardness coupled with an elongation to break of 100 to 450% as measured according to ASTM D412. Preferably, the polishing layer of the chemical mechanical polishing pad used in the method of the present invention exhibits an elongation to break of 125 to 425% (still more preferably 150 to 350%; most preferably 150 to 200%) as measured according to ASTM D412.

Preferably, the polishing layer of the chemical mechanical polishing pad used in the method of the present invention exhibits a cut rate of 25 to 150 µm/hr as measured using the method described herein in the Examples. More preferably, the polishing layer of the chemical mechanical polishing pad used in the method of the present invention exhibits a cut rate of 30 to 125 µm/hr (still more preferably 30 to 100 µm/hr; most preferably 30 to 60 µm/hr) as measured using the method described herein in the Examples.

The polishing layer of the chemical mechanical polishing pad used in the method of the present invention has a polishing surface adapted for polishing the substrate. Preferably, the polishing surface has macrotexture selected from at least one of perforations and grooves. Perforations can extend from the polishing surface part way or all the way through the thickness of the polishing layer. Preferably, grooves are arranged on the polishing surface such that upon rotation of the chemical mechanical polishing pad during polishing, at least one groove sweeps over the surface of the silicon substrate being polished. Preferably, the polishing surface has macrotexture including at least one groove selected from the group consisting of curved grooves, linear grooves and combinations thereof.

Preferably, polishing layer of the chemical mechanical polishing pad used in the method of the present invention has a polishing surface adapted for polishing the substrate, wherein the polishing surface has a macrotexture comprising a groove pattern formed therein. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, sawtooth, and combinations thereof.

Figure 2:
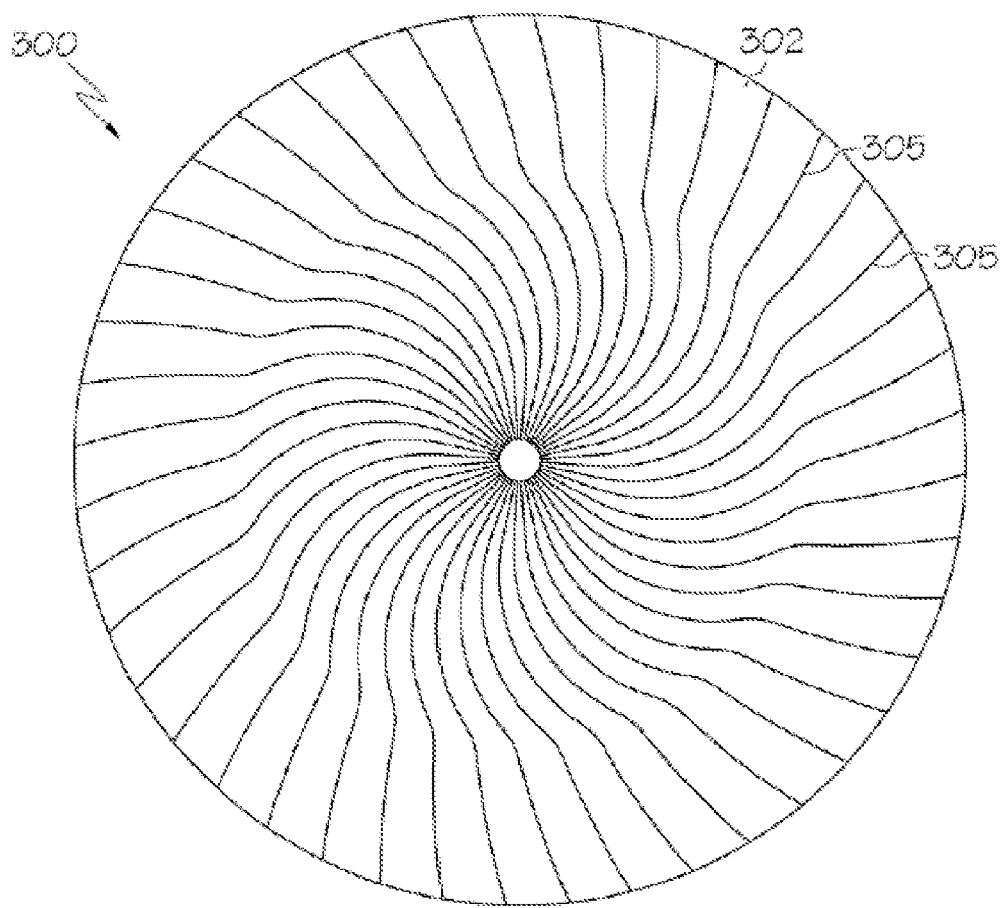
FIG. 2 is a top plan view of a preferred polishing layer of a chemical mechanical polishing pad used in the method of the present invention depicting a spiral groove pattern in the polishing surface of the polishing layer.

In FIG. 2 there is provided a top plan view of a preferred polishing layer for use in the method of the present invention. In particular, FIG. 5 depicts a polishing layer 300 having a polishing surface, 302, with a groove pattern of a plurality of curved grooves, 305.

Figure 3:
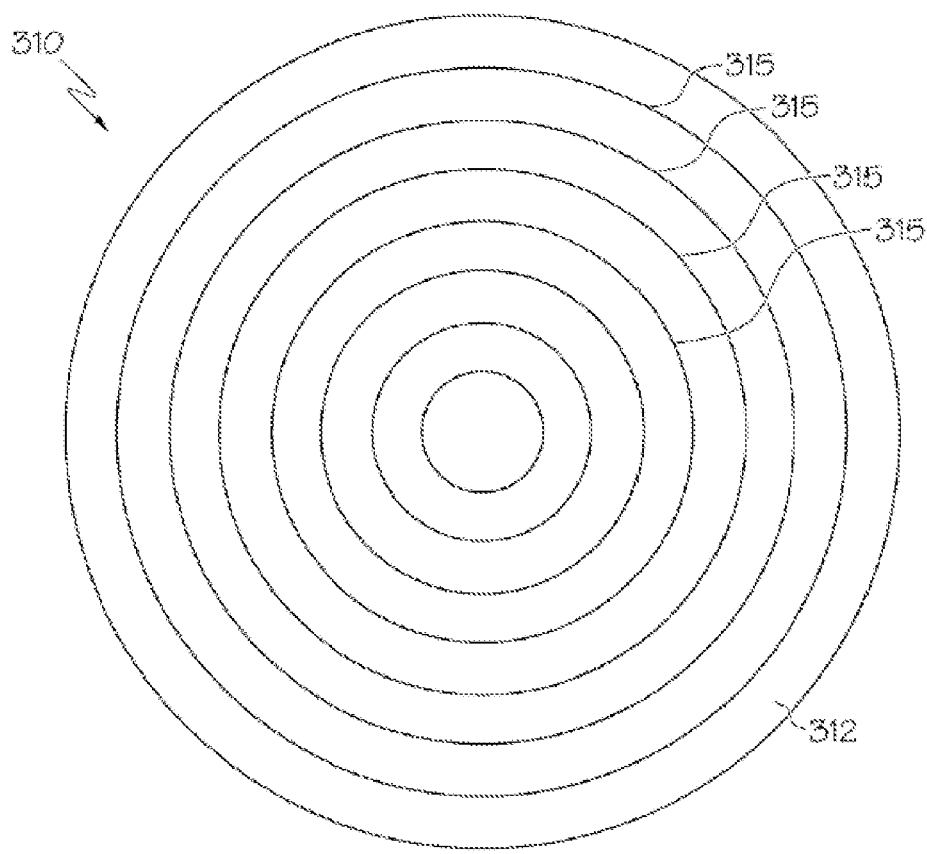
FIG. 3 is a top plan view of a preferred polishing layer of a chemical mechanical polishing pad used in the method of the present invention depicting a concentric circular groove pattern in the polishing surface of the polishing layer.

In FIG. 3 there is provided a top plan view of a preferred polishing layer for use in the method of the present invention. In particular, FIG. 3 depicts a polishing layer, 310, having a polishing surface, 312, with a groove pattern of a plurality of concentric, circular grooves, 315.

Figure 4:
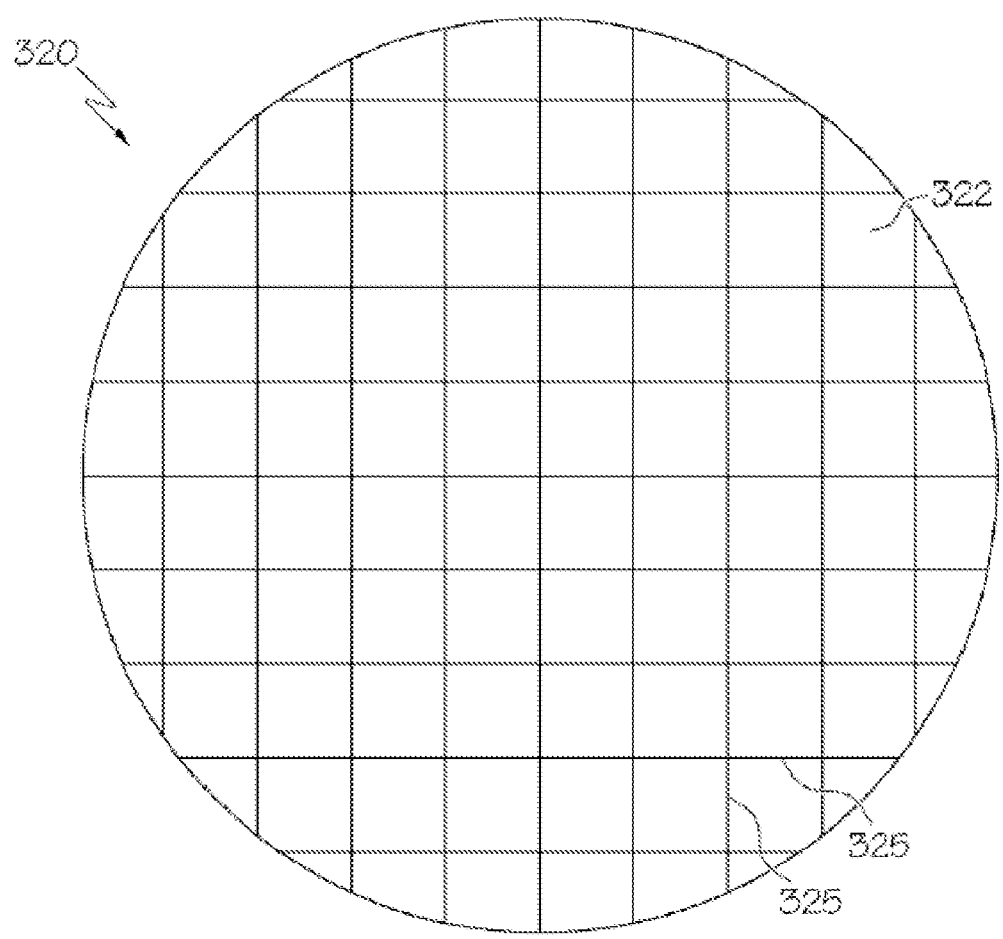
FIG. 4 is a top plan view of a preferred polishing layer of a chemical mechanical polishing pad used in the method of the present invention depicting an X-Y grid groove pattern in the polishing surface of the polishing layer.

In FIG. 4 there is provided a top plan view of a preferred polishing layer for use in the method of the present invention. In particular, FIG. 4 depicts a polishing layer, 320, having a polishing surface, 322, with a groove pattern of a plurality of linear grooves, 325, in an X-Y grid pattern.

Figure 5:
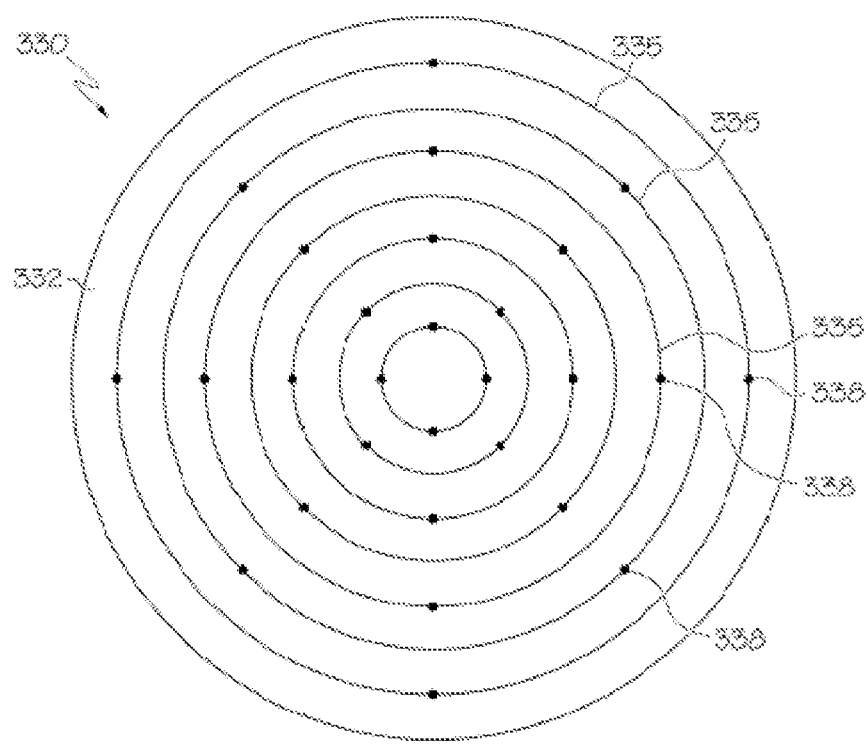
FIG. 5 is a top plan view of a preferred polishing layer of a chemical mechanical polishing pad used in the method of the present invention depicting perforations coupled with a concentric circular groove pattern in the polishing surface of the polishing layer.

In FIG. 5 there is provided a top plan view of a preferred polishing layer for use in the method of the present invention. In particular, FIG. 5 depicts a polishing layer, 330, having a polishing surface, 332, with a combination of a plurality of perforations, 338, and a plurality of concentric circular grooves, 335.

Figure 6:
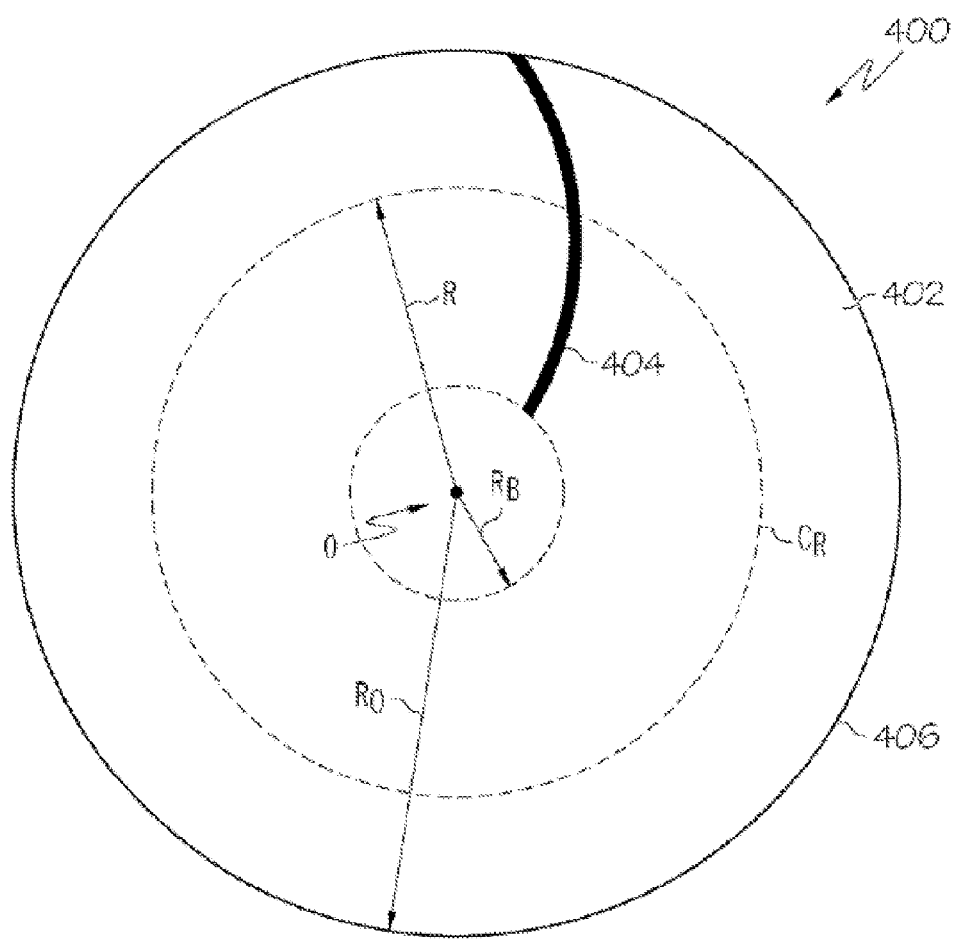
FIG. 6 is a top plan view of a preferred polishing layer of a chemical mechanical polishing pad used in the method of the present invention depicting a portion of a groove pattern in the polishing surface of the polishing layer.
Figure 7:
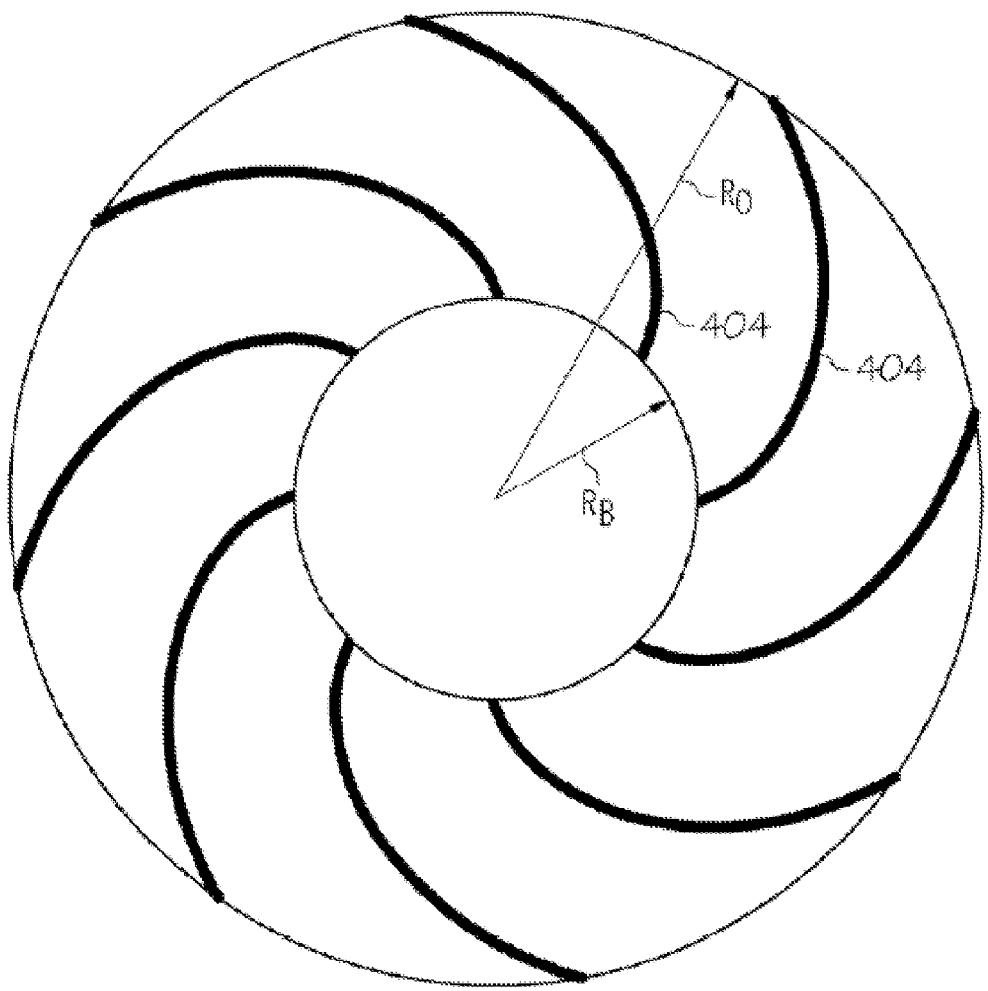
FIG. 7 is a top plan view of a preferred polishing layer of a chemical mechanical polishing pad used in the method of the present invention with a groove pattern in the polishing surface comprising eight curved grooves.
Figure 8:
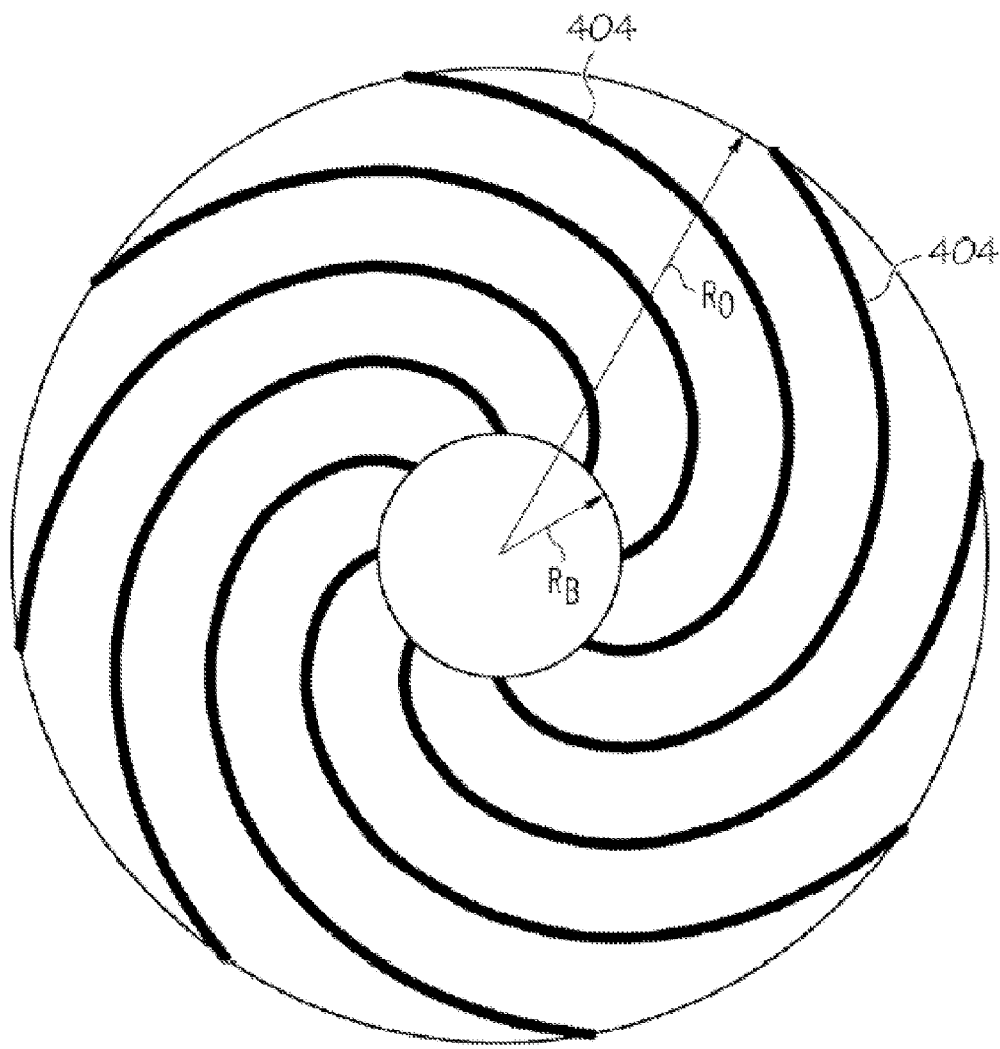
FIG. 8 is a top plan view of a preferred polishing layer of a chemical mechanical polishing pad used in the method of the present invention with a groove pattern in the polishing surface comprising eight curved grooves.
Figure 9:
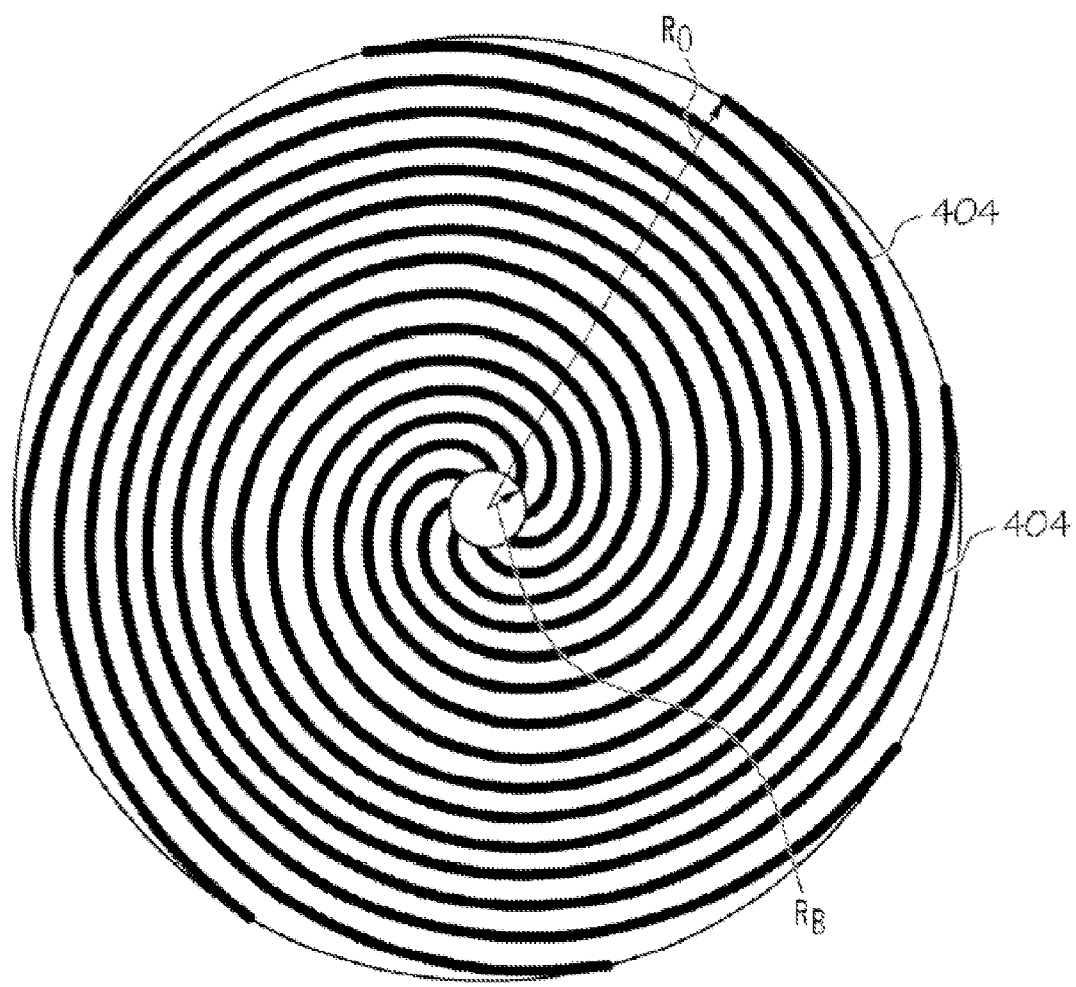
FIG. 9 is a top plan view of a preferred polishing layer of a chemical mechanical polishing pad used in the method of the present invention with a groove pattern in the polishing surface comprising eight curved grooves.
Figure 10:
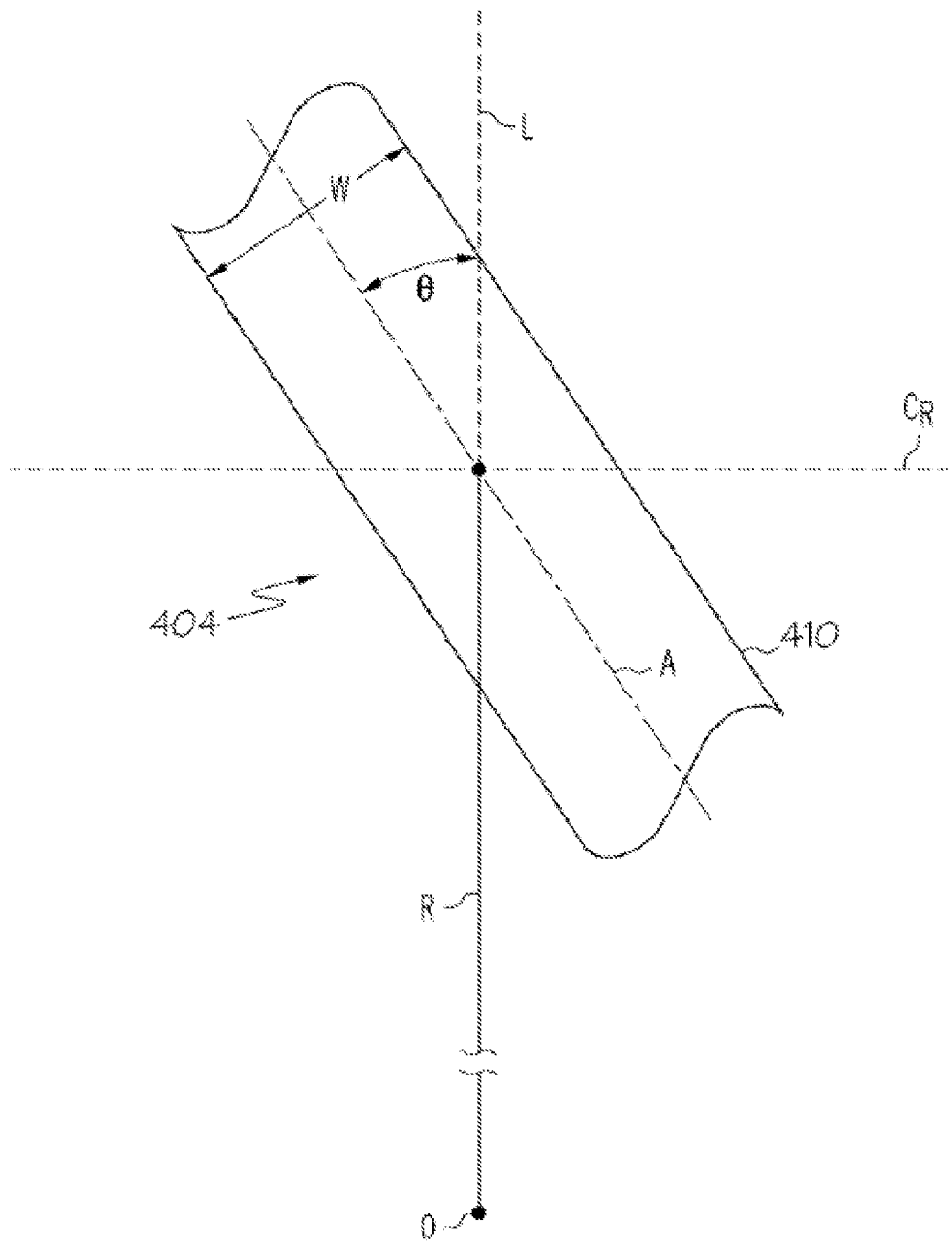
FIG. 10 is an exploded view of the groove 404 of FIG. 6.

In FIG. 6 there is provided a top plan view of a preferred polishing layer for use in the method of the present invention. In particular, FIG. 6 depicts a polishing layer, 400, wherein the polishing layer, 400, has an outer radius, $R_O$, and a polishing surface, 402; wherein the polishing surface, 402, has a macrotexture comprising a groove pattern that comprises at least one groove, 404. Although only a single groove 404 is depicted in FIG. 6, the groove pattern can comprise two or more grooves, 404. (See, e.g., FIGS. 7-9). The polishing layer radius, R, is measured from an origin O at the center of the polishing surface, 402. A circle $C_R$ (dashed line) drawn at radius R with a circumference 2πR is shown in FIG. 6. The outer radius of polishing layer, 400, is $R_O$. The at least one groove, 404, preferably extends from base radius $R_B$ to outer radius, $R_O$, which defines the outer periphery, 406, of the polishing surface, 402. Optionally, the at least one groove, 404, extend from a point between the origin, O, and the base radius, $R_B$, to outer periphery 406. Optionally, the at least one groove, 404, extends from the origin, O, to outer periphery 406. FIG. 10 depicts an exploded view of a groove segment of a groove, 404, of FIG. 9 showing a small differential segment, 410, of a groove, 404. At a given radius, R, the groove, 404, has a given width, W, and a central axis, A, that forms an angle, θ ("groove angle"), with respect to a radial line, L, connecting the origin, O, to the given radius, R.

Preferably, the polishing layer of the chemical mechanical polishing pad used in the method of the present invention has a polishing surface with a groove pattern that comprises at least one groove, wherein CF remains within 25% (preferably, within 10%; more preferably, within 5%) of its average value as a function of the radius, R, in an area extending from an outer radius, $R_O$, of the polishing surface a majority distance to an origin, O, at a center of the polishing surface. Preferably, CF remains within 25% (preferably, within 10%; more preferably, within 5%) of its average value as a function of radius, R, in an area extending from a base radius, $R_B$, to an outer radius, $R_O$. (See FIGS. 6-9).

Preferably, the polishing layer used in the chemical mechanical polishing pad used in the method of the present invention has an average thickness, T, of 20 to 150 mils. More preferably, the polishing layer used has an average thickness of 30 to 125 mils (still more preferably 40 to 120 mils; most preferably 50 to 100 mils). (See FIG. 1).

The chemical mechanical polishing pad used in the method of the present invention optionally further comprises at least one additional layer interfaced with the polishing layer. Preferably, the chemical mechanical polishing pad used in the method of the present invention optionally further comprises a compressible base layer adhered to the polishing layer. The compressible base layer preferably improves conformance of the polishing layer to the surface of the silicon substrate being polished.

Some embodiments of the present invention will now be described in detail in the following Examples.

Examples 1-22

Polishing layers were prepared according to the formulation details provided in TABLE 3. Specifically, polyurethane cakes were prepared by the controlled mixing of the isocyanate terminated urethane prepolymer at 51° C. (i.e., the Adiprene® LF667 for Examples 1-9 and 20-22 and the Adiprene® LFG963A for Examples 10-19 are available from Chemtura Corporation) with the components of the curative package. The amine initiated polyol curative (i.e., the Voranol® 800 available from The Dow Chemical Company) and the high molecular weight polyol curative (i.e., the Voralux® HF505 available from The Dow Chemical Company) were premixed before blending in the other raw materials. All of the raw materials, except for MBOCA, were maintained at a premixing temperature of 51° C. The MBOCA was maintained at a premixing temperature of 116° C. The ratio of the isocyanate terminated urethane prepolymer and the curative package was set such that the stoichiometry, as defined by the ratio of active hydrogen groups (i.e., the sum of the —OH groups and —NH$_2$ groups) in the curatives to the unreacted isocyanate (NCO) groups in the isocyanate terminated urethane prepolymer, was as noted in Table 3.

Porosity was introduced into the polishing layers by adding pore formers to the isocyanate terminated urethane prepolymer prior to combining with the curative package to achieve the desired porosity and pad density.

The isocyanate terminated urethane prepolymer with any incorporated pore former and the curative package were mixed together using a high shear mix head. After exiting the mix head, the combination was dispensed over a period of 5 minutes into an 86.4 cm (34 inch) diameter circular mold to give a total pour thickness of approximately 10 cm (4 inches). The dispensed combination was allowed to gel for 15 minutes before placing the mold in a curing oven. The mold was then cured in the curing oven using the following cycle: 30 minutes ramp from ambient temperature to a set point of 104° C., then hold for 15.5 hours at 104° C., and then 2 hour ramp from 104° C. to 21° C.

The cured polyurethane cakes were then removed from the mold and skived (cut using a moving blade) at a temperature of 30 to 80° C. into approximately forty separate 2.0 mm (80 mil) thick sheets. Skiving was initiated from the top of each cake. Any incomplete sheets were discarded.

Note that Adiprene® LF667 used in the Examples is a PTMEG based isocyanate terminated urethane prepolymer comprising a 50/50 weight percent blend of Adiprene® LF950A and Adiprene® LF600D available from Chemtura. Also note that Adiprene® LFG963A is a PPG based isocyanate terminated urethane prepolymer available from Chemtura.

TABLE 3

| Ex # | Isocyanate terminated urethane prepolymer | Prepolymer (% NCO) | Curative Package (wt %) | | | Stoichiometry (Active H/NCO) | Pore Former ※ | Former wt % | Porosity vol % |
|---|---|---|---|---|---|---|---|---|---|
| | | | MBOCA | Voranol® 800 | Voralux® HF 505 | | | | |
| 1 | Adiprene ® LF667 | 6.7 | 0 | 25 | 75 | 0.97 | 920DE40d30 | 1.3 | 34 |
| 2 | Adiprene ® LF667 | 6.7 | 67 | 8 | 25 | 0.97 | 920DE40d30 | 1.3 | 34 |
| 3 | Adiprene ® LF667 | 6.7 | 0 | 14 | 86 | 1.0 | 551DE40d42 | 1.4 | 29 |
| 4 | Adiprene ® LF667 | 6.7 | 14 | 12 | 74 | 1.0 | 551DE40d42 | 1.4 | 29 |
| 5 | Adiprene ® LF667 | 6.7 | 25 | 11 | 64 | 1.0 | 551DE40d42 | 1.4 | 28 |
| 6 | Adiprene ® LF667 | 6.7 | 25 | 11 | 64 | 1.0 | 551DE40d42 | 0.6 | 15 |
| 7 | Adiprene ® LF667 | 6.7 | 40 | 9 | 51 | 1.0 | 551DE40d42 | 1.4 | 28 |
| 8 | Adiprene ® LF667 | 6.7 | 50 | 7 | 43 | 1.0 | 551DE40d42 | 1.6 | 32 |

TABLE 3-continued

| | Isocyanate | | Curative Package (wt %) | | | Pore | | |
|---|---|---|---|---|---|---|---|---|
| Ex # | terminated urethane prepolymer | Prepolymer (% NCO) | MBOCA | Voranol ® 800 | Voralux ® HF 505 | Stoichiometry (Active H/NCO) | Pore Former ※ | Former wt % | Porosity vol % |
| 9 | Adiprene ® LF667 | 6.7 | 50 | 7 | 43 | 1.0 | 551DE40d42 | 0.7 | 18 |
| 10 | Adiprene ® LFG963A | 5.8 | 14 | 12 | 74 | 1.0 | 551DE20d60 | 2.0 | 28 |
| 11 | Adiprene ® LFG963A | 5.8 | 33 | 10 | 57 | 1.0 | 551DE20d60 | 2.0 | 28 |
| 12 | Adiprene ® LFG963A | 5.8 | 14 | 12 | 74 | 1.0 | 551DE20d60 | 1.4 | 22 |
| 13 | Adiprene ® LFG963A | 5.8 | 33 | 10 | 57 | 1.0 | 551DE20d60 | 1.5 | 23 |
| 14 | Adiprene ® LFG963A | 5.8 | 41 | 8 | 51 | 1.0 | 551DE20d60 | 1.4 | 22 |
| 15 | Adiprene ® LFG963A | 5.8 | 33 | 10 | 57 | 1.0 | — | — | — |
| 16 | Adiprene ® LFG963A | 5.8 | 0 | 25 | 75 | 1.0 | 551DE20d60 | 2.0 | 28 |
| 17 | Adiprene ® LFG963A | 5.8 | 0 | 14 | 86 | 1.0 | 551DE20d60 | 1.8 | 26 |
| 18 | Adiprene ® LFG963A | 5.8 | 25 | 19 | 56 | 1.0 | 551DE40d42 | 1.6 | 32 |
| 19 | Adiprene ® LFG963A | 5.8 | 25 | 19 | 56 | 1.0 | 551DE40d42 | 0.7 | 17 |
| 20 | Adiprene ® LF667 | 6.7 | 67 | 5 | 28 | 1.0 | 551DE40d42 | 2.0 | 32 |
| 21 | Adiprene ® LF667 | 6.7 | 67 | 5 | 28 | 1.0 | 920DE80d30 | 0.8 | 36 |
| 22 | Adiprene ® LF667 | 6.7 | 67 | 5 | 28 | 1.0 | Matsumoto[¶] | 0.6 | 41 |

※Unless otherwise noted, the pore formers listed in TABLE 3 are Expancel ® pore formers commercially available from Akzo Nobel N.V.
[¶] Pore former microcapsules having average particles size of 150 μm commercially available from Matsumoto Yushi-Seiyaku Co., Ltd.

The ungrooved, polishing layer materials from each of Examples 1-22 were analyzed to determine their physical properties as reported in TABLE 4. Note that the density data reported were determined according to ASTM D1622; the Shore D hardness data reported were determined according to ASTM D2240; the Shore A hardness data reported were determined according to ASTM D2240; and, the elongation to break data reported were determined according to ASTM D412.

The cut rate data reported in TABLE 4 were measured using a 200 mm Mirra® polishing tool from Applied Materials. This polishing tool is designed to accommodate a circular chemical mechanical polishing pad having a nominal diameter of 51 cm (20 inches). Polishing layers having a circular cross section were prepared as described herein in the Examples. These polishing layers were then machine grooved to provide a groove pattern in the polishing surface comprising a plurality of concentric circular grooves having dimensions of 120 mil (3.05 mm) pitch, 20 mil (0.51 mm) width and 30 mil (0.76 mm) depth. The polishing layers were then laminated to a foam sub-pad layer (SP2310 available from Rohm and Haas Electronic Materials CMP Inc.)

A diamond conditioning disk (DiaGrid® AD3CL-150840-3 pad conditioner manufactured by Kinik Company) was used to abrade the polishing surface of the grooved polishing layers using the following process conditions: the polishing surface of the polishing layers were subjected to continuous abrasion from the diamond conditioning disk for a period of 2 hours, with a platen speed of 100 rpm, a deionized water flow rate of 150 cm³/min and a conditioning disk down force of 48.3 kPa (7 psi). The cut rate was determined by measuring the change in the average groove depth over time. The groove depth was measured (in μm/hour) using an MTI Instruments Microtrack II Laser Triangulation Sensor mounted on a Zaber Technologies Motorized Slide to profile the polishing surface of each polishing layer from the center to the outer edge. The sweep speed of the sensor on the slide was 0.732 mm/s and the sampling rate (measurements/mm of sweep) for the sensor was 6.34 points/mm. The cut rate reported in TABLE 4 is the arithmetic average reduction in groove depth over time, based on the collected thickness measurements taken as >2,000 points across the polishing surface of the polishing layer.

TABLE 4

| | Density | Shore Hardness | | G' @ 30° C. | G' @ 40° C. | G" @ 40° C. | G' @ 30° C./ G' @ 90° C. | Tensile strength | Elongation to break | Tensile modulus | Toughness | Cut rate |
|---|---|---|---|---|---|---|---|---|---|---|---|---|
| Ex. # | (g/cm³) | A | D | (MPa) | (MPa) | (MPa) | (MPa) | (MPa) | (%) | (MPa) | (MPa) | (μm/hr) |
| 1 | 0.76 | 56 | 10 | 3.2 | 3.1 | 0.1 | 1.0 | 3 | 161 | 4 | 3 | — |
| 2 | 0.76 | 83 | 35 | 27.8 | 24.2 | 2.7 | 1.4 | 16 | 250 | 46 | 23 | — |
| 3 | 0.81 | 48 | 7 | 2.2 | 2.2 | 0.1 | 1.1 | 2 | 160 | 3 | 2 | 72 |
| 4 | 0.81 | 57 | 11 | 4.6 | 3.8 | 0.5 | 1.5 | 5 | 294 | 5 | 9 | 41 |
| 5 | 0.82 | 62 | 18 | 9.0 | 8.2 | 0.9 | 1.3 | 7 | 360 | 13 | 15 | — |
| 6 | 0.98 | 61 | 17 | 5.0 | 4.6 | 0.5 | 1.1 | 8 | 414 | 7 | 16 | — |
| 7 | 0.82 | 75 | 23 | 16.8 | 15.6 | 1.4 | 1.3 | 11 | 346 | 26 | 22 | 30 |
| 8 | 0.79 | 79 | 27 | 21.4 | 19.7 | 1.6 | 1.4 | 12 | 332 | 36 | 26 | 29 |
| 9 | 0.95 | 83 | 31 | 23.2 | 21.5 | 1.9 | 1.2 | 16 | 351 | 40 | 34 | — |
| 10 | 0.83 | 56 | 10 | 6.0 | 4.5 | 0.9 | 2.8 | 4 | 189 | 6 | 5 | 46 |
| 11 | 0.82 | 75 | 23 | 18.6 | 13.4 | 3.0 | 6.0 | 7 | 256 | 31 | 13 | — |
| 12 | 0.90 | 61 | 14 | 8.2 | 6.4 | 1.2 | 3.1 | 4 | 164 | 8 | 4 | — |
| 13 | 0.88 | 72 | 21 | 18.1 | 13.8 | 3.1 | 5.1 | 7 | 288 | 24 | 15 | — |
| 14 | 0.89 | 77 | 25 | 23.6 | 18.7 | 3.8 | 5.2 | 9 | 291 | 33 | 18 | 43 |
| 15 | 1.14 | 78 | 27 | 21.2 | 15.6 | 3.7 | 4.7 | 10 | 293 | 23 | 18 | — |
| 16 | 0.83 | 55 | 10 | 5.6 | 4.5 | 0.7 | 2.0 | 3 | 162 | 4 | 3 | — |
| 17 | 0.85 | 57 | 11 | 4.6 | 4.0 | 0.4 | 1.7 | 3 | 143 | 4 | 2 | — |
| 18 | 0.78 | 70 | 19 | 18.0 | 13.3 | 2.6 | 4.7 | 5 | 173 | 23 | 7 | — |
| 19 | 0.96 | 73 | 20 | 17.9 | 12.5 | 2.9 | 5.4 | 7 | 232 | 23 | 11 | — |
| 20 | 0.76 | 85 | 37 | 49.1 | 43.7 | 4.3 | 1.5 | 14 | 303 | 40 | 29 | — |

TABLE 4-continued

| Ex. # | Density (g/cm³) | Shore Hardness A | Shore Hardness D | G' @ 30° C. (MPa) | G' @ 40° C. (MPa) | G" @ 40° C. (MPa) | G' @ 30° C./ G' @ 90° C. (MPa) | Tensile strength (MPa) | Elongation to break (%) | Tensile modulus (MPa) | Toughness (MPa) | Cut rate (μm/hr) |
|---|---|---|---|---|---|---|---|---|---|---|---|---|
| 21 | 0.73 | 83 | 33 | 30.1 | 25.7 | 3.0 | 1.5 | 13 | 303 | 34 | 25 | — |
| 22 | 0.68 | 80 | 28 | 18.5 | 15.9 | 1.9 | 1.4 | 8 | 217 | 25 | 12 | — |

Polishing Examples P1-P3

These polishing experiments were performed using 200 mm Si(100) wafers, which were pre-etched in a 0.5 wt % hydrofluoric acid solution for 90 seconds, using a 20″ platen polisher (Strasbaugh) and a polishing layer prepared according to Examples 20-22, respectively, wherein the polishing surface of each polishing layer exhibited an XY type groove pattern having a 0.6 mm depth, 2.5 mm width and 15.75 mm pitch; with a down force of 9.8 kPa, a chemical mechanical polishing composition flow rate of 300 ml/min, a table rotation speed of 115 rpm and a carrier rotation speed of 100 rpm. The chemical mechanical polishing composition used was NP8030 (1:30 dilution ratio) (commercially available from Nitta Haas Inc.). In each of Polishing Examples P1-P3, the front surface of the silicon wafer was polishing under the noted conditions for five (5) minutes. The polished front surface of each of the silicon wafers was then analyzed for haze using an LS6600 unpatterned wafer inspection system available from Hitachi High Technologies Corporation. The results are provided in TABLE 5.

TABLE 5

| Ex. # | Haze (in ppm) |
|---|---|
| P1 | 0.0705 |
| P2 | 0.0716 |
| P3 | 0.0733 |

Comparative Polish Examples PA1-PA2 and Polishing Examples P4-P9

SPP800S (Okamoto) polisher—800 mm platen size; 300 mm wafer size.

These polishing experiments were performed using 300 mm Si(100) wafers, which were pre-etched in a 0.5 wt % hydrofluoric acid solution for 90 seconds, using an 800 mm platen polisher (SPP800S Okamoto) and a polishing layers identified in TABLE 6 with a down force of 9.8 kPa, a chemical mechanical polishing composition flow rate of 1 L/min, a table rotation speed of 40 rpm and a carrier rotation speed of 39 rpm. The chemical mechanical polishing composition used was NP8030 (1:30 dilution ratio) (commercially available from Nitta Haas Inc.). In each of Comparative Polish Examples PA1-PA2 and Polishing Examples P4-P9, the front surface of the silicon wafer was polishing under the noted conditions for five (5) minutes. The polished front surface of each of the silicon wafers was then analyzed for haze using an LS6600 unpatterned wafer inspection system available from Hitachi High Technologies Corporation. The results are provided in TABLE 7.

TABLE 6

| Ex. # | Polishing Layer | Groove Pattern |
|---|---|---|
| PA1 | Ciegal 7355 | XY having a 0.6 mm depth, 2.5 mm width and 15.75 mm pitch |
| PA2 | Polypas ® | Embossed with a circular groove pattern 0.40 mm depth, 1.0 mm width and 4.0 mm pitch |
| P4 | Ex. 6 | XY having a 0.6 mm depth, 2.5 mm width and 15.75 mm pitch |
| P5 | Ex. 9 | XY having a 0.6 mm depth, 2.5 mm width and 15.75 mm pitch |
| P6 | Ex. 4 | XY having a 0.6 mm depth, 2.5 mm width and 15.75 mm pitch |
| P7 | Ex. 4 | Constant area spiral groove pattern with 14 grooves, 20 mil depth, 30 mil width |
| P8 | Ex. 4 | Constant area spiral groove pattern with 24 grooves, 40 mil depth, 30 mil width |
| P9 | Ex. 4 | Circular groove pattern, 40 mil depth, 14 mil width, 70 mil pitch |

Ciegal 7355 final polishing pads are available from Chiyoda Co., Ltd.
Polypas ® 27-3-1S polishing pad are available from Fujibo Ehime Co., Ltd.

TABLE 7

| Ex. # | Haze (in ppm) |
|---|---|
| PA1 | 0.0885 |
| PA2 | 0.0783 |
| P4 | 0.0715 |
| P5 | 0.0699 |
| P6 | 0.1017 |
| P7 | 0.1049 |
| P8 | 0.0985 |
| P9 | 0.1000 |

We claim:

1. A method for polishing a silicon wafer, comprising:
providing a silicon wafer, having a surface;
providing a chemical mechanical polishing pad, wherein the chemical mechanical polishing pad comprises a polishing layer which is the reaction product of raw material ingredients, comprising:
a polyfunctional isocyanate; and,
a curative package, comprising:
at least 5 wt % of an amine initiated polyol curative, wherein the amine initiated polyol curative contains at least one nitrogen atom per molecule; wherein the amine initiated polyol curative has an average of at least three hydroxyl groups per molecule;
25 to 95 wt % of a high molecular weight polyol curative, wherein the high molecular weight polyol curative has a number average molecular weight, $M_N$, of 2,500 to 100,000; and wherein the high molecular weight polyol curative has an average of 3 to 10 hydroxyl groups per molecule; and,
0 to 70 wt % of a difunctional curative;
wherein the polishing layer exhibits a density of greater than 0.4 g/cm³; a Shore D hardness of 5 to 40; an elongation to break of 100 to 450%; and, a cut rate of 25 to 150 µm/hr; and, wherein the polishing layer has a polishing surface adapted for polishing the silicon wafer; and, creating dynamic contact between the polishing surface of the polishing layer and the surface of the silicon wafer, wherein the surface of the silicon wafer is polished.

2. The method of claim 1, wherein the surface of the silicon wafer is a front surface; and, wherein the front surface of the silicon wafer is haze free polished to a haze of <0.075 ppm.

3. The method of claim 2, wherein the stoichiometric ratio of the reactive hydrogen groups in the curative package to the unreacted isocyanate groups in the polyfunctional isocyanate is 0.85 to 1.15.

4. The method of claim 2, wherein the polyfunctional isocyanate is selected from the group consisting of an aliphatic polyfunctional isocyanate, an aromatic polyfunctional isocyanate and a mixture thereof.

5. The method of claim 4, wherein the difunctional curative is selected from the group consisting of diol curatives and diamine curatives.

6. The method of claim 4, wherein the polyfunctional isocyanate is an isocyanate-terminated urethane prepolymer having 2 to 12 wt % unreacted NCO groups.

7. The method of claim 6, wherein the curative package, comprises:

5 to 20 wt % of the amine initiated polyol curative, wherein the amine initiated polyol curative contains two nitrogen atom per molecule; wherein the amine initiated polyol curative has an average of 4 hydroxyl groups per molecule; and, wherein the amine initiated polyol curative has a number average molecular weight, $M_N$, of 200 to 400;

50 to 75 wt % of the high molecular weight polyol curative, wherein the high molecular weight polyol curative has a number average molecular weight, $M_N$, of 10,000 to 12,000; and, wherein the high molecular weight polyol curative has an average of 6 hydroxyl groups per molecule;

10 to 30 wt % of the difunctional curative; wherein the difunctional curative is a diamine curative selected from the group consisting of 4,4'-methylene-bis-(2-chloroaniline) (MBOCA); 4,4'-methylene-bis-(3-chloro-2,6-diethylaniline) (MCDEA); and, isomers thereof;

wherein the stoichiometric ratio of the reactive hydrogen groups in the curative package to the unreacted isocyanate groups in the polyfunctional isocyanate is 0.95 to 1.05;

wherein the polishing layer exhibits a density of 0.65 to 0.85 g/cm³; a Shore D hardness of 10 to 40; an elongation to break of 150 and 350%; and, a cut rate of 30 to 60 µm/hr.

8. The method of claim 7, wherein the isocyanate-terminated urethane prepolymer has 5 to 7 wt % unreacted NCO groups; and, wherein the isocyanate-terminated urethane prepolymer exhibits a number average molecular weight, $M_N$, of 400 to 2,500.

9. The method of claim 8, wherein the polishing layer has a spiral groove pattern formed therein.

10. The method of claim 9, wherein the circumference fraction grooved remains within 10% of its average value as a function of a radius of the polishing layer in an area extending from an outer perimeter of the polishing surface a majority distance to a center of the polishing surface.

* * * * *